(12) United States Patent
Van Noort

(10) Patent No.: US 7,659,600 B2
(45) Date of Patent: Feb. 9, 2010

(54) SEMICONDUCTOR DEVICE AND METHOD OF MANUFACTURING SUCH A DEVICE

(75) Inventor: Wibo Daniel Van Noort, Leuven (BE)

(73) Assignee: NXP B.V., Eindhoven (NL)

( * ) Notice: Subject to any disclaimer, the term of this patent is extended or adjusted under 35 U.S.C. 154(b) by 245 days.

(21) Appl. No.: 11/568,196

(22) PCT Filed: Apr. 12, 2005

(86) PCT No.: PCT/IB2005/051198

§ 371 (c)(1),
(2), (4) Date: Oct. 23, 2006

(87) PCT Pub. No.: WO2005/104235

PCT Pub. Date: Nov. 3, 2005

(65) Prior Publication Data

US 2008/0169527 A1    Jul. 17, 2008

(30) Foreign Application Priority Data

Apr. 27, 2004  (EP) .................................. 04101770

(51) Int. Cl.
*H01L 29/00*    (2006.01)
(52) U.S. Cl. ....................................................... 257/528
(58) Field of Classification Search ......... 257/528–543, 257/E27.071, E27.048
See application file for complete search history.

(56) References Cited

U.S. PATENT DOCUMENTS 5,231,042 A * 7/1993 Ilderem et al. .............. 438/533

* cited by examiner

*Primary Examiner*—Cuong Q Nguyen

(57) ABSTRACT

The invention relates to a semiconductor device (10) with a semiconductor body (1) comprising a high-ohmic semiconductor substrate (2) which is covered with a dielectric layer (3) containing charges, on which dielectric layer one or more passive electronic components (4) comprising conductor tracks (4) are present, and at the location of the passive elements (4) a semiconductor region (5) is present at the interface between the semiconductor substrate (2) and the dielectric layer (3, 4), a first conductivity-type conducting channel induced in the semiconductor substrate (2) by the charges being interrupted by, and at the location of, the semiconductor region (5).

Figure 1:
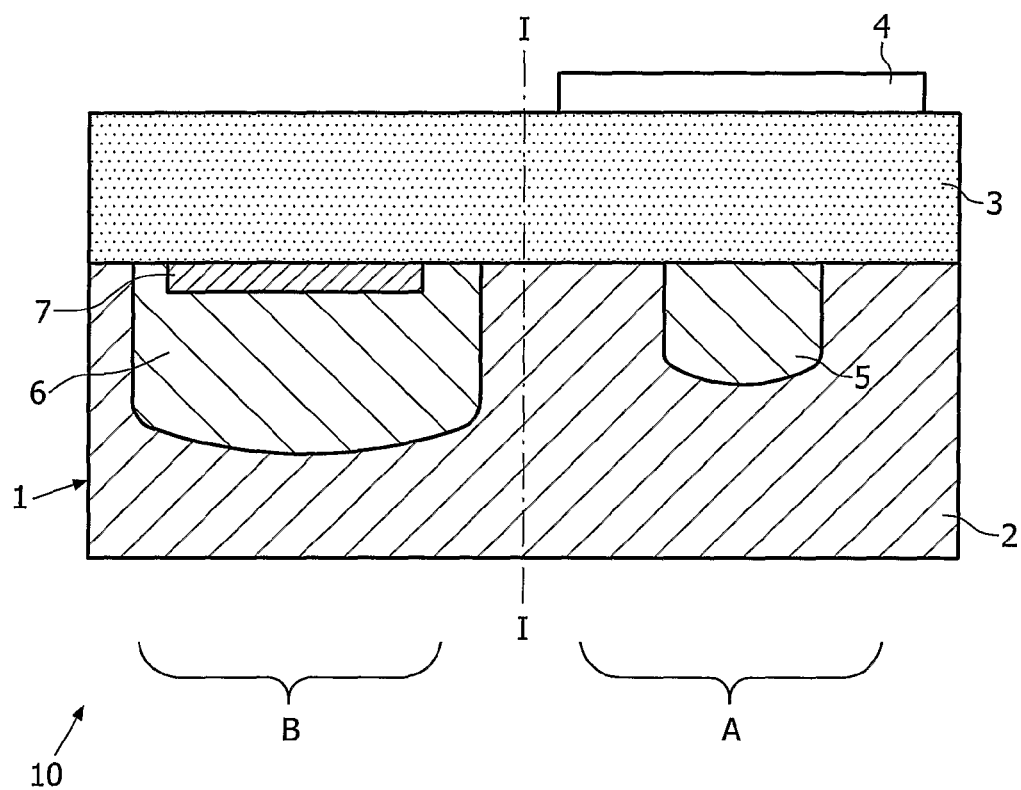

According to the invention, the semiconductor region (5) is monocrystalline and of a second conductivity type, opposite to the first conductivity type. In this way the charge of an induced channel is locally compensated by the charge of the semiconductor regions (5). The device (10) has a very low high-frequency power loss, because the inversion channel is interrupted at the location of the semiconductor region (5). The device (10) further allows for a higher thermal budget and thus for the integration of active semiconductor elements (8) into the semiconductor body (1). Preferably, the semiconductor region (5) comprises a large number of strip-shaped sub-regions (5A, 5B, 5C).

12 Claims, 4 Drawing Sheets

SEMICONDUCTOR DEVICE AND METHOD OF MANUFACTURING SUCH A DEVICE

The invention relates to a semiconductor device with a semiconductor body comprising a high-ohmic semiconductor substrate which is covered with a dielectric layer which contain charges, on which dielectric layer one or more passive electronic elements are present, including conductor tracks, and, at the location of the passive elements, a semiconductor region is present at the interface between the semiconductor substrate and the dielectric layer, as a result of which an electroconductive channel of a first conductivity type induced by the charges is interrupted at the semiconductor substrate-dielectric layer interface at the location of the semiconductor region. In this application, a high-ohmic semiconductor substrate is to be taken to mean, in particular, a semiconductor substrate whose resistivity is larger than, or equal to, approximately 1 kΩcm and, in practice, ranges between 1 and 10 kΩcm. An electroconductive channel may be an inversion channel or an accumulation channel. This depends on the charge in the dielectric layer, which in practice is often positive, leading to the formation of an n-type channel, and on the conductivity type of the semiconductor substrate. In the case of a p-type substrate, for example, inversion then occurs; and in the case of an n-type substrate accumulation occurs. The invention also relates to a method of manufacturing such a device.

A device and a method of the type mentioned in the opening paragraph are known from Japanese patent specification JP-A-08-316420, published on 29 Nov. 1996, under said publication number. In said document, a description is given of a device comprising a high-ohmic silicon substrate which is provided with a dielectric layer in the form of a silicon dioxide layer on which wiring is present. To counteract high-frequency power losses resulting from the development of an inversion or accumulation layer at the interface between the silicon substrate and the silicon dioxide layer, a polycrystalline or amorphous silicon region formed by damaging the crystal structure of the silicon substrate by means of ion implantation is present at said interface. The region thus formed comprises charge traps which, at said location, take up the charge of an inversion or accumulation channel formed and thus locally interrupt said channel. By virtue thereof, the (high-frequency) power losses are limited.

A drawback of the known device resides in that, in practice, it sometimes presents problems which correspond to a reduction of the effective resistance of the high-ohmic semiconductor substrate, which leads to said losses.

Therefore, it is an object of the present invention to provide a device of the type mentioned in the opening paragraph, in which the semiconductor substrate shows high-ohmic behavior under a greater variety of conditions. A further object relates to the provision of a simple method of manufacturing such a device.

To achieve this, a device of the type mentioned in the opening paragraph is characterized, in accordance with the invention, in that said semiconductor region is monocrystalline and of a second conductivity type, which is opposite to the first conductivity type. The invention is based first of all on the recognition that the problem of the development of a too highly conducting semiconductor substrate occurs, in particular, in devices in which also semiconductor elements are integrated in the semiconductor body. The concomitant integration processes sometimes require, particularly at the beginning of the manufacturing process, a comparatively high temperature budget. A thermal treatment at a comparatively high temperature enables the crystallinity of the polycrystalline or amorphous region of the known device to be restored, either completely or partly, causing the concentration of charge traps to be reduced, thereby enabling, for example, the undesirable formation of an inversion channel. The invention is further based on the recognition that an inversion channel can be interrupted not only by means of so-termed traps, but also by providing the semiconductor region with a conductivity type which is opposite to that of the induced channel. Notwithstanding the fact that the substrate is high-ohmic, it is still either p-conductive or n-conductive. This may be indicated by means of a π-type substrate and a v-type substrate, respectively. In the case of a positive charge in the dielectric layer, the induced channel will be an inversion channel, in the first case, and an accumulation channel in the second case. A suitable semiconductor region will, in that case, be of the p-conductivity type and hence comprise positive charges which compensate for the induced charges. By virtue thereof, the charge of the conducting channel is always compensated at the location of the semiconductor region, as a result of which the channel is interrupted or at least has a much higher ohmic value. The introduction of doping atoms of the opposite conductivity type can take place without the crystallinity of the semiconductor substrate being affected or influenced thereby. Said introduction may take place, for example, by means of diffusion. If the semiconductor region of the opposite conductivity type is formed by implantation, which does cause damage to the crystal structure, the crystallinity may be restored, deliberately or not, by a thermal treatment, without the favorable effect of the measure according to the invention being lost. The invention is finally based on the recognition that although the doped semiconductor region may of itself have a comparatively low resistance, said resistance value can be made so low, in practice, that this does not have any adverse effect. This can be achieved by choosing the dimensions of the semiconductor region to be sufficiently small and by choosing the doping concentration thereof to be such that it is not higher than necessary for interrupting a channel. On the basis of the above, it will be clear that the possible necessity of a high thermal budget to form integrated semiconductor elements in the semiconductor body of the device in accordance with the invention will cause no difficulties.

In a preferred embodiment of a device in accordance with the invention, the semiconductor region of the second conductivity type comprises a number of mutually parallel strip-shaped sub-regions which are recessed in the semiconductor substrate. Said strip-shaped sub-regions preferably extend parallel to the direction of a conductor track, i.e. at right angles to the direction in which a voltage gradient is introduced into the substrate. A large number of strip-shaped sub-regions enables the effect to be optimized on an existing pattern of conductor tracks extending parallel to said strip-shaped sub-regions. A larger number of strip-shaped sub-regions can be applied without problems, by virtue of the fact that the dimensions of the sub-regions can be very small. By recessing the region or the sub-regions into the semiconductor substrate, ion implantation can be used for the formation. This technique permits the smallest possible dimensions. Besides, in this embodiment the best charge compensation is achieved because said charge is present predominantly at the interface between the semiconductor substrate and the dielectric layer. Preferably, the strip-shaped sub-regions are interconnected near their end portions.

In a favorable modification, the strip-shaped sub-regions form two groups of sub-regions intersecting each other at an angle of 90 degrees. By virtue thereof, the semiconductor region is effective for mutually perpendicular conductor tracks which preferably each extend parallel to one of the two groups.

A further embodiment is characterized in that the strip-shaped sub-regions form a network of regular hexagons. This causes the effect to be optimized for conductor tracks which extend perpendicularly to one of the facets of a hexagon and which mutually include an angle of approximately 60 degrees.

In a further embodiment, the semiconductor body has a further semiconductor region comprising one or more semiconductor elements integrated therein. This enables the device to comprise, in addition to passive elements and conductor tracks, for example an IC (=Integrated Circuit). The passive elements are preferably situated, viewed in projection, in another part of the device than the further semiconductor region with the semiconductor elements.

As noted hereinabove, the dimensions and the doping concentration of the semiconductor region are preferably sufficiently large to interrupt an inversion or accumulation channel formed during operation, but also sufficiently small to not substantially reduce the square resistance of the substrate.

A method of manufacturing a semiconductor device with a semiconductor body, wherein a dielectric layer containing charges is formed on a high-ohmic semiconductor substrate, on which dielectric layer one or more passive electronic elements, including conductor tracks, are provided, and wherein, at the location of the passive elements, a semiconductor region is formed at the interface between the semiconductor substrate and the dielectric layer, as a result of which an electroconductive channel of a first conductivity type induced by the charges is interrupted at the semiconductor substrate-dielectric layer interface at the location of the semiconductor region, is characterized in accordance with the invention in that the semiconductor region is rendered monocrystalline and provided with a second conductivity type, which is opposite to the first conductivity type. A device in accordance with the invention is thus obtained. Preferably, the semiconductor region is formed by means of ion implantation. Suitable ions for an n-type substrate are boron ions, and suitable ions for a p-type substrate are arsenic or antimony ions.

These and other aspects of the invention are apparent from and will be elucidated with reference to the embodiments described hereinafter.

Figure 4:
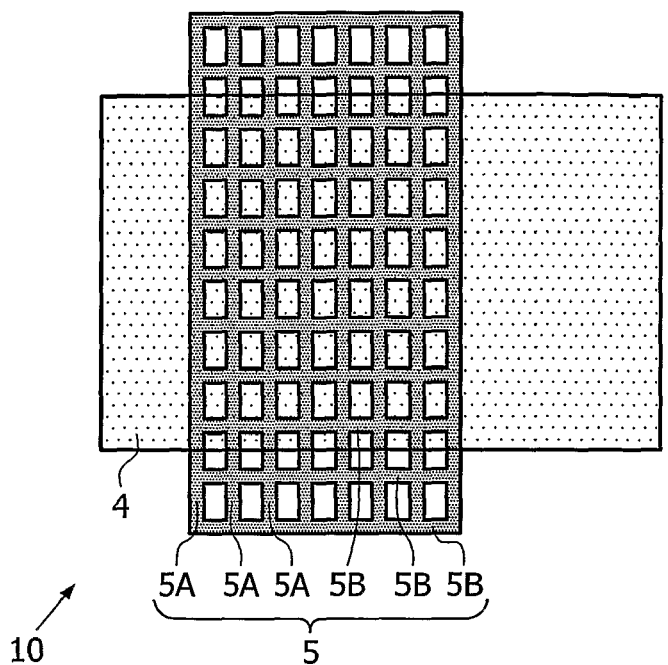
Figure 5:
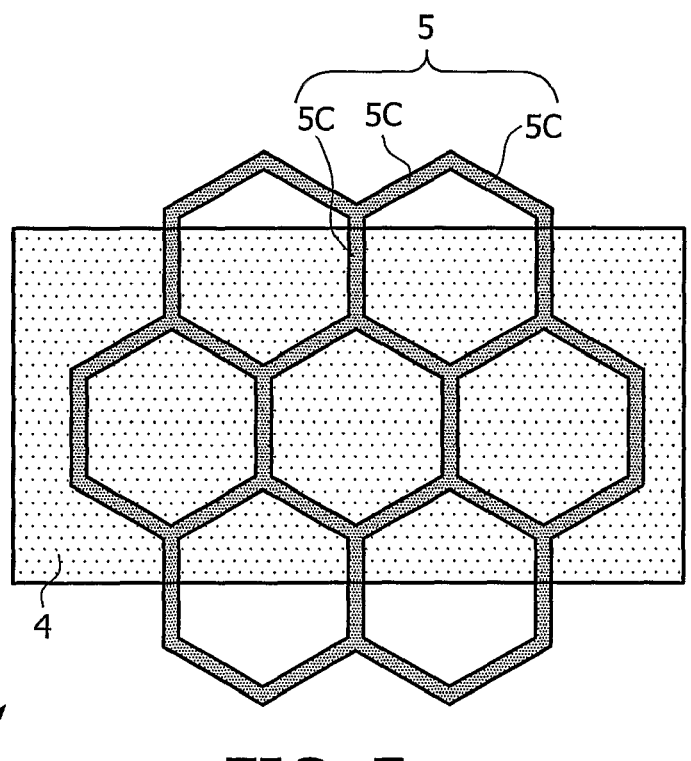
Figure 6:
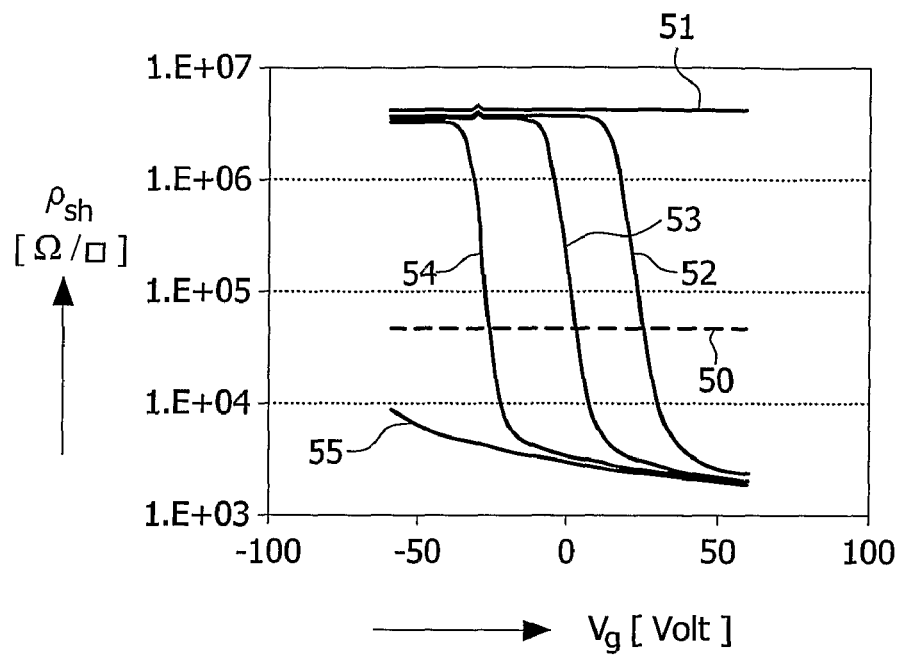
Figure 7:
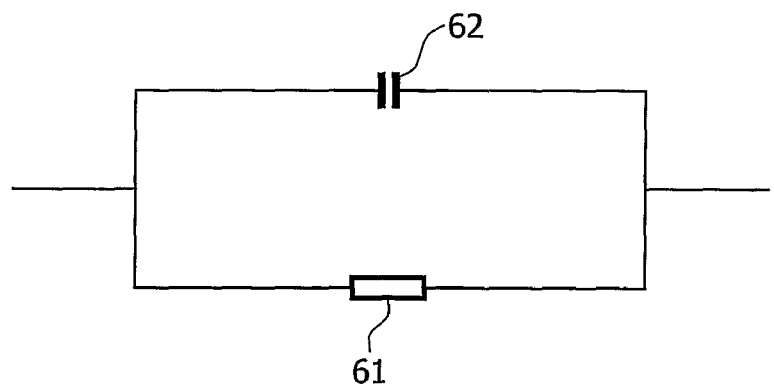

In the drawings:

FIG. 1 is a diagrammatic cross-sectional view, at right angles to the thickness direction, of a semiconductor device in accordance with the invention, FIGS. 2 through 5 are diagrammatic plan views of a number of different possibilities of configurations of the semiconductor region of the device shown in FIG. 1, FIG. 6 shows the square resistance of the substrate of the device shown in FIG. 1, as a function of the voltage on a conductor track, and for different doping concentrations in the semiconductor region, and FIG. 7 shows the equivalent-circuit diagram of the substrate of the device shown in FIG. 1.

The Figures are not drawn to scale and some dimensions, such as dimensions in the thickness direction, are exaggerated for clarity. Corresponding regions or parts in the different Figures are indicated by means of the same hatching or the same reference numerals whenever possible.

Figure 2:
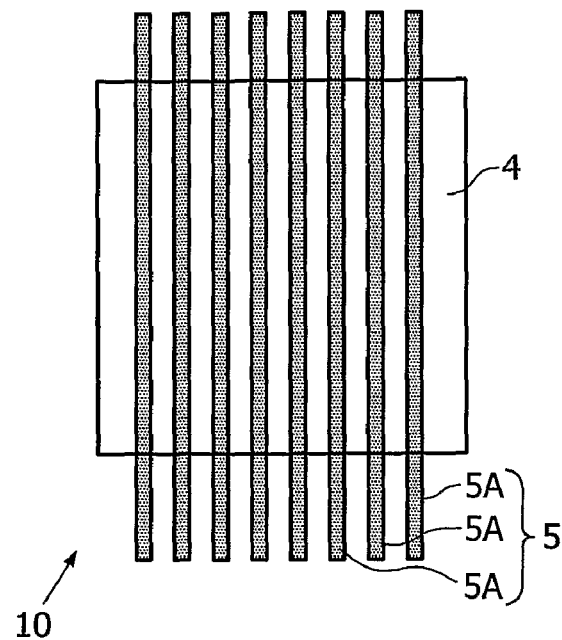
Figure 3:
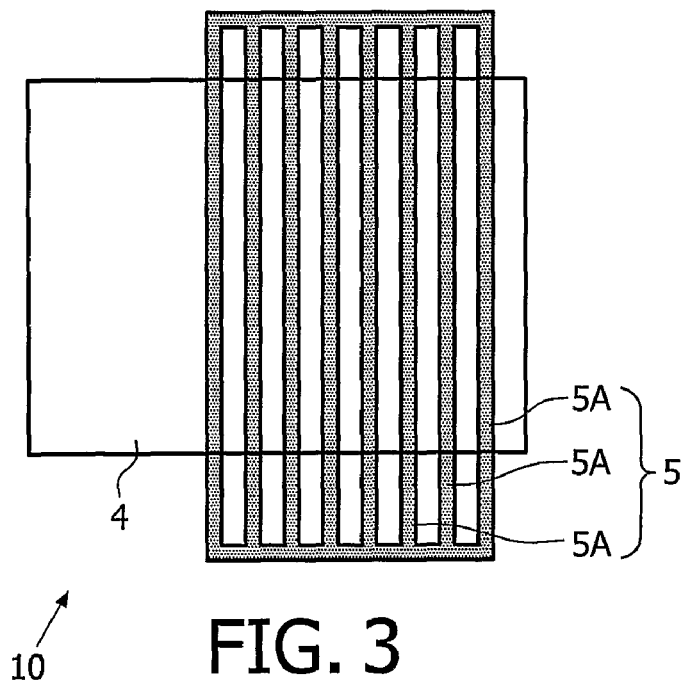

FIG. 1 is a diagrammatic cross-sectional view, at right angles to the thickness direction, of a semiconductor device in accordance with the invention, and FIGS. 2 through 4 are diagrammatic plan views of different possibilities of configurations of the semiconductor region of the device shown in FIG. 1. The device 10 comprises a semiconductor body 1 with a high-ohmic silicon semiconductor substrate 2 of the p-conductivity type, the specific resistance of which ranges, in this case, between 5 and 10 kΩcm. The surface of the device 10 is covered with a dielectric layer 3 of silicon dioxide. The conductivity type of a conductive channel induced during operation is the n-conductivity type, because the dielectric layer contains a positive charge ranging between, for example, $1 \times 10^{11}$ cm$^{-2}$ and $2 \times 10^{12}$ cm$^{-2}$. The semiconductor device 10 of this example comprises two sub-regions A, B which are situated, respectively, to the right and to the left of the line I-I. The right-hand part A comprises a semiconductor region 5 of the p-conductivity type, which is recessed in the surface of the device. This semiconductor region extends parallel to a passive element 4 in the form of a conductor track 4. By virtue of the semiconductor region 5, an inversion channel is interrupted, during operation of the device, at the semiconductor substrate 2-dielectric layer 3 interface, at the location of the semiconductor region 5. By virtue thereof, the device 10 exhibits very limited (high-frequency) losses.

The left-hand part B of the device 10 comprises a further semiconductor region 6 in which a semiconductor element 7 is integrated. It is noted that the semiconductor element 7 may comprise an integrated circuit of, for example, bipolar and/or MOS transistors. The passive elements 4 may comprise a pattern of conductor tracks for electrically connecting the one or more semiconductor elements 7. In addition, the passive elements 4 may comprise one or more capacitors and/or resistors and/or coils.

In FIG. 1, the semiconductor region 5 is represented as a single strip-shaped region 5 which extends perpendicularly to the plane of the drawing. Preferably, the semiconductor region 5 comprises a larger number of strip-shaped sub-regions. These may be formed in many different configurations in the semiconductor body 2.

An example of such a configuration is shown in FIG. 2. The semiconductor region 5 shown in said Figure comprises a larger number of mutually parallel, spaced apart sub-regions 5A which extend parallel to a conductor track 4. In FIG. 3, the strip-shaped sub-regions 5A are interconnected near their end portions. FIG. 4 shows that the semiconductor region 5 comprises two groups of sub-regions 5A, 5B which intersect each other at right angles. Such a configuration is suitable, in particular, if the conductor tracks 4 also extend approximately in two mutually perpendicular directions on the surface of the dielectric layer 3. Another configuration of strip-shaped sub-regions 5C of the semiconductor region 5 is shown in FIG. 5. The hexagonal pattern shown in this Figure is very suitable in the case that conductor tracks 4 extend in more than two directions.

FIG. 6 shows the square resistance (Rsh) of the substrate of the device shown in FIG. 1, as a function of the voltage (Vg) on a conductor track, and for different doping concentrations in the semiconductor region. This is based on the assumption of a fixed positive charge in the dielectric layer 3 of $+2 \times 10^{12}$ cm$^{-2}$. Line 50 corresponds to a level of the square resistance that is acceptable. Curves 51, 52, 53, 54, 55 correspond to a doping concentration of the semiconductor region 5 of, respectively, $2 \times 10^{18}$, $6 \times 10^{17}$, $4 \times 10^{17}$, $2 \times 10^{17}$, $2 \times 10^{16}$ at/cm$^3$. Dependent upon the voltage domain that exists for a conductor track 4 in a specific case, the necessary doping concentration for the semiconductor region 5 can be read by means of FIG. 7. For a maximum Vg of 30 V, a minimum doping concentration of approximately $6 \times 10^{17}$ at/cm$^3$ is suitable. In practice, the doping concentration is preferably chosen to be as low as possible, because this enables the surface of the semiconductor region 5 to be chosen as large as possible. Doping concentrations below those mentioned here are permissible if the charge in the dielectric layer is lower than the value mentioned hereinabove. In an optimal process, this charge may be a factor of 10 lower than the value indicated above. The minimum dimensions of the semiconductor region 5 are approximately 0.4 μm to 250 nm for, respectively, I-line lithography and DUV (=Deep UltraViolet) lithography. A comparatively small depth of the semiconductor region 5, which can be achieved using the currently available technology, is, for example, 100 nm. The strip-shaped semiconductor region 5 is preferably made as narrow and as thick as the technology permits.

FIG. 7 shows the equivalent circuit diagram of the substrate of the device shown in FIG. 1. If the modulus of the square impedance (ZsH) of the substrate of a device in accordance with the invention is plotted as a function of the frequency f, then a curve can be observed having a high-frequency part and a low-frequency part which are distinguishable by a constant value for the low-frequency part and a 1/f dependence for the high-frequency part. As an impedance is concerned here, the high-frequency part corresponds to the characteristic properties of a capacitance. A similar curve can be reproduced using the equivalent circuit diagram of FIG. 7. That is to say, the characteristics correspond to those of a resistance 61 arranged in parallel with a capacitance 62.

As the resistance 61 for higher frequencies (1 GHz or higher) is generally very high as compared to the impedance of the capacitance 62 (1/jωC), only the latter has to be taken into account. Simulations have shown that the doping concentration in a substrate with a single (p-type) strip-shaped region has substantially no influence on the capacitance 62 (the high-frequency part of the curve). By connecting in series a larger number (n) of strip-shaped sub-regions, an effective capacitance of C/n will then be achievable. The number (n) is limited, of course, by the available space, the minimum width of the strip-shaped sub-regions and by the fact that too high a density of strip-shaped sub-regions will adversely affect the conductivity of the substrate, i.e. increase said conductivity.

The device 10 is manufactured as follows, using a method in accordance with the invention. For the starting material use is made (see FIG. 1) of a high-ohmic, here n-type, semiconductor substrate 2 on which a thin dielectric layer is provided by means of thermal oxidation. A photoresist layer is applied onto said dielectric layer by means of spinning. Subsequently, a mask corresponding to the desired pattern of the semiconductor region 5 to be formed is provided and the photoresist layer is patterned by means of photolithography. Next, use is made of, in this case, ion implantation to form the p-type semiconductor region 5 by means of, in this case, boron ions. By virtue of the fact that the implantation takes place through the dielectric layer, the thickness of the semiconductor region 5 can be as small as possible. The flux of the ion implantation is chosen in conformity with the desired doping concentration of the semiconductor region 5. The other regions and parts, including the further semiconductor region 6 and the active elements 7 in part B of the device 10, are provided in the semiconductor body 1 by means of customary IC technology. The same applies to the conductor tracks 4 and/or other passive elements in part A of the device 10.

The invention is not limited to the exemplary embodiment described herein, and within the scope of the invention many variations and modifications are possible to those skilled in the art. For example, devices having a different geometry and/or different dimensions can be manufactured.

It is to be noted that materials other than those mentioned in the examples can alternatively be used within the scope of the invention. Also other deposition techniques can be used for the above-mentioned, or other, materials, such as epitaxy, CVD (=Chemical Vapor Deposition), sputtering and vaporization. Instead of wet-chemical etch methods, use can be made of "dry" techniques, such as plasma etching, and vice versa.

It is further noted that, at the location of the passive elements, the device may also comprise discrete active elements which are mounted on the dielectric layer.

The invention claimed is:

1. A semiconductor device with a semiconductor body comprising:
   a high-ohmic semiconductor substrate covered with a dielectric layer configured to contain charges, the dielectric layer having one or more passive electronic elements thereon including conductor tracks,
   at the location of the passive elements, a semiconductor region at the interface between the semiconductor substrate and the dielectric layer and configured to interrupt, at the location of the semiconductor region, an electroconductive channel of a first conductivity type induced by the charges at the semiconductor substrate-dielectric layer interface,
   wherein said semiconductor region is monocrystalline and of a second conductivity type, the second conductivity type being opposite to the first conductivity type.

2. The semiconductor device as recited in claim 1, wherein the semiconductor region of the second conductivity type includes a number of mutually parallel strip-shaped sub-regions which are recessed in the semiconductor substrate.

3. The semiconductor device as recited in claim 1, wherein the strip-shaped sub-regions are interconnected near their end portions.

4. The semiconductor device as recited in claim 2, wherein the strip-shaped sub-regions comprise two groups of sub-regions intersecting each other at an angle of 90 degrees.

5. The semiconductor device as recited in claim 2, wherein the strip-shaped sub-regions form a network of regular hexagons.

6. The semiconductor device as recited in claim 1, wherein the semiconductor body has a further semiconductor region comprising one or more semiconductor elements integrated therein.

7. The semiconductor device as recited in claim 6, characterized in that, when viewed in projection, the passive elements are situated in a part of the semiconductor device, and the further semiconductor region with the semiconductor elements is situated in another part of the semiconductor device.

8. The semiconductor device as recited in claim 1, wherein the dimensions and the doping concentration of the semiconductor region are sufficiently large to interrupt an inversion or accumulation channel formed during operation, but also sufficiently small to not substantially reduce the square resistance of the substrate.

9. A semiconductor device with a semiconductor body comprising:
   a high-ohmic semiconductor substrate;
   a dielectric layer configured with charges to induce an electroconductive channel of a first conductivity type in the substrate;
   a passive electronic element on the dielectric layer and including conductor tracks; and at an interface between the semiconductor substrate and the dielectric layer, a monocrystalline semiconductor region of a second conductivity type that is opposite to the first conductivity type, the monocrystalline semiconductor region being configured to interrupt the electroconductive channel.

10. The device of claim 9, wherein the passive electronic element and the monocrystalline semiconductor region are vertically aligned and separated by the dielectric layer, and the monocrystalline semiconductor region is laterally adjacent to and separates portions of the channel region.

11. The device of claim 9, wherein the monocrystalline semiconductor region has a width that is less than a width of the electroconductive channel.

12. The device of claim 9, further including a plurality of aligned conductor tracks on the surface of the dielectric layer that electrically connect passive electronic elements including said passive electronic element, and wherein the monocrystalline semiconductor region includes a plurality of strip-shaped sub-regions arranged parallel to the conductor tracks.

* * * * *